(12) United States Patent
Cho et al.

(10) Patent No.: US 8,586,425 B2
(45) Date of Patent: Nov. 19, 2013

(54) THIN FILM TRANSISTOR

(75) Inventors: An-Thung Cho, Hualien County (TW);
Wan-Yi Liu, Hsinchu (TW); Chia-Kai Chen, Taichung County (TW);
Wu-Hsiung Lin, Hsinchu (TW);
Chun-Hsiun Chen, Hsinchu (TW);
Wei-Ming Huang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 168 days.

(21) Appl. No.: 12/964,747

(22) Filed: Dec. 10, 2010

(65) Prior Publication Data

US 2011/0156043 A1  Jun. 30, 2011

(30) Foreign Application Priority Data

Dec. 31, 2009 (TW) .............................. 98146361 A

(51) Int. Cl.
*H01L 21/00* (2006.01)
*H01L 21/84* (2006.01)

(52) U.S. Cl.
USPC .......................................................... 438/149

(58) Field of Classification Search
USPC ........ 257/57–70, E21.414, E21.347; 438/149
See application file for complete search history.

(56) References Cited

U.S. PATENT DOCUMENTS

| | | | |
|---|---|---|---|
| 5,243,202 A | 9/1993 | Mori et al. | |
| 6,064,091 A | 5/2000 | Deane et al. | |
| 6,087,730 A | 7/2000 | McGarvey et al. | |
| 6,327,006 B1 | 12/2001 | Sato et al. | |
| 7,125,758 B2 | 10/2006 | Choi et al. | |
| 7,221,039 B2 | 5/2007 | Huang et al. | |
| 7,408,597 B2 | 8/2008 | Lee et al. | |
| 2003/0155588 A1 | 8/2003 | Murade | |
| 2005/0029514 A1 | 2/2005 | Moriya | |

(Continued)

FOREIGN PATENT DOCUMENTS

| | | |
|---|---|---|
| TW | 200832516 | 8/2008 |
| TW | 200947089 | 11/2009 |
| WO | 0011709 | 3/2000 |

OTHER PUBLICATIONS

Sazonov et al., "Dielectric performance of low temperature silicon nitride films in a-Si:H TFTs," Journal of Non-Crystalline Solids 299-302, Apr. 2002, pp. 1360-1364.

(Continued)

*Primary Examiner* — Julio J Maldonado
*Assistant Examiner* — Sonya D McCall Shepard
(74) *Attorney, Agent, or Firm* — Jianq Chyun IP Office

(57) ABSTRACT

A thin film transistor disposed on a substrate is provided. The thin film transistor includes a gate, a gate insulating layer, a silicon-rich channel layer, a source, and a drain. The gate is disposed on the substrate. The gate insulator is disposed over the gate. The silicon-rich channel layer is disposed above the gate, wherein the material of the silicon-rich channel layer is selected from a group consisting of silicon-rich silicon oxide (Si-rich SiOx), silicon-rich silicon nitride (Si-rich SiNx), silicon-rich silicon oxynitride (Si-rich SiOxNy), silicon-rich silicon carbide (Si-rich SiC) and silicon-rich silicon oxycarbide (Si-rich SiOC). The content (concentration) of silicon of the silicon-rich channel layer within a film depth between 10 nm to 170 nm ranges from about 1E23 atoms/cm$^3$ to about 4E23 atoms/cm$^3$. The source and the drain are connected with the silicon-rich channel layer.

2 Claims, 9 Drawing Sheets

(56) References Cited

U.S. PATENT DOCUMENTS

2005/0148143 A1* 7/2005 Yang et al. .................... 438/283
2006/0043377 A1   3/2006 Hoffman et al.
2008/0179762 A1   7/2008 Cho et al.

OTHER PUBLICATIONS

"Office Action of Taiwan counterpart application" issued on Nov. 7, 2012, p. 1-p. 10.

* cited by examiner

THIN FILM TRANSISTOR

CROSS-REFERENCE TO RELATED APPLICATION

This application claims the priority benefit of Taiwan application serial no. 98146361, filed on Dec. 31, 2009. The entirety of the above-mentioned patent application is hereby incorporated by reference herein and made a part of this specification.

BACKGROUND OF THE INVENTION

1. Field of the Invention

The present invention relates to a thin film transistor. More particularly, the present invention relates to a thin film transistor having high carrier mobility and favorable reliability.

2. Description of Related Art

With rapid progress in semiconductor manufacturing techniques, various displays have been continuously launched. To satisfy requirements of lightness, slimness, shortness, compactness, portability, and so on, the displays characterized by flexibility and convenience in carrying have become the dominant type in the next generation of the displays. For instance, development of flexible displays and electronic papers are have gradually concerned by manufacturers. Specifically, thin film transistors are widely used in displays and performance of the thin film transistors is affected by the structural designs or the material of the thin film transistors directly.

Generally, the thin film transistor at least include a gate, a source, a drain, and a channel layer, wherein conductivity of the channel layer is determined by the voltage applied to the gate. Specifically, the source and the drain are electrically conducted with each other when the channel layer is turned on or electrically insulated from each other when the channel layer is turned off. In addition, an N-doped ohmic contact layer or a P-doped ohmic contact layer may be usually formed on the channel layer so as to reduce contact resistance between the channel layer and the source/drain. In conventional thin film transistors, the material of the channel layer of the thin film transistors includes amorphous silicon ($\alpha$-Si) or poly-silicon (p-Si).

Regardless the channel layer is made from amorphous silicon ($\alpha$-Si) or poly-silicon (p-Si), high process temperature is required when thin film transistors are fabricated. For instance, the process temperature is greater than 280 degrees centigrade when the channel layers of the thin film transistors are made from amorphous silicon (so-called $\alpha$-Si TFTs). Accordingly, when $\alpha$-Si TFTs are used in the application of flexible displays, flexible substrates (e.g. plastic substrate) of flexible displays are deteriorated or deformed resulted from high process temperature. In other words, conventional $\alpha$-Si TFTs are not suitable for application of flexible displays. On the other hand, application of conventional $\alpha$-Si TFTs are restricted due to poor carrier mobility (less than 1 $cm^2/V$-s) and reliability thereof.

SUMMARY OF THE INVENTION

The present invention is directed to a thin film transistor having relatively high carrier mobility and favorable reliability.

The present invention is further directed to a thin film transistor widely used in different applications.

As embodied and broadly described herein, a thin film transistor disposed on a substrate is provided in the present application. The thin film transistor includes a gate, a gate insulating layer, a silicon-rich channel layer, a source, and a drain. The gate is disposed on the substrate. The gate insulator is disposed over the gate. The silicon-rich channel layer is disposed above the gate, wherein the material of the silicon-rich channel layer is selected from a group consisting of silicon-rich silicon oxide (Si-rich SiOx), silicon-rich silicon nitride (Si-rich SiNx), silicon-rich silicon oxynitride (Si-rich SiOxNy), silicon-rich silicon carbide (Si-rich SiC) and silicon-rich silicon oxycarbide (Si-rich SiOC). The content (concentration) of silicon of the silicon-rich channel layer ranges from about 1E23 atoms/$cm^3$ to about 4E23 atoms/$cm^3$. The source and the drain are connected with the silicon-rich channel layer.

In one embodiment of the present application, the material of the gate includes molybdenum (Mo).

In one embodiment of the present application, the material of the gate insulating layer includes silicon oxide (SiOx), silicon nitride (SiNx), silicon oxynitride (SiOxNy), silicon carbide (SiC) or silicon oxycarbide (SiOC).

In one embodiment of the present application, the material of the source and the drain includes titanium/aluminum/titanium (Ti/Al/Ti) composite metal layer.

In one embodiment of the present application, the source and the drain are disposed on a portion area of the gate insulating layer, while the silicon-rich channel layer is disposed on the source, the drain, and a portion area of the gate insulating layer uncovered by the source and the drain.

In one embodiment of the present application, the silicon-rich channel layer is disposed on a portion area of the gate insulating layer, while the source and the drain are disposed on the silicon-rich channel layer.

In one embodiment of the present application, the thin film transistor further includes an ohmic contact layer between the silicon-rich channel layer and the source or between the silicon-rich channel layer and the drain, wherein the material of the ohmic contact layer is selected from a group consisting of silicon-rich silicon oxide (Si-rich SiOx), silicon-rich silicon nitride (Si-rich SiNx), silicon-rich silicon oxynitride (Si-rich SiOxNy), silicon-rich silicon carbide (Si-rich SiC) and silicon-rich silicon oxycarbide (Si-rich SiOC). The content (concentration) of silicon of the ohmic contact layer within a film depth between 10 nm and 170 nm ranges from about 1E23 atoms/$cm^3$ to about 4E23 atoms/$cm^3$.

As embodied and broadly described herein, another thin film transistor disposed on a substrate is also provided in the present application. The source and the drain are disposed on the substrate. The silicon-rich channel layer is disposed on the substrate so as to cover the source and the drain. The material of the silicon-rich channel layer is selected from a group consisting of silicon-rich silicon oxide (Si-rich SiOx), silicon-rich silicon nitride (Si-rich SiNx), silicon-rich silicon oxynitride (Si-rich SiOxNy), silicon-rich silicon carbide (Si-rich SiC) and silicon-rich silicon oxycarbide (Si-rich SiOC). The content (concentration) of silicon of the silicon-rich channel layer within a film depth between 10 nm to 170 nm ranges from about 1E23 atoms/$cm^3$ to about 4E23 atoms/$cm^3$. The gate insulating layer is disposed on the silicon-rich channel layer. The gate is disposed on the gate insulating layer.

Since the silicon content (concentration) of the silicon-rich channel layer in the thin film transistor of the present application ranges from about 1E23 atoms/$cm^3$ to about 4E23 atoms/$cm^3$, the thin film transistor of the present application has favorable carrier mobility and reliability. In addition, since the process temperature required during the thin film transistor of the present application is fabricated is low, the thin film transistor of the present application can be widely used in different applications.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
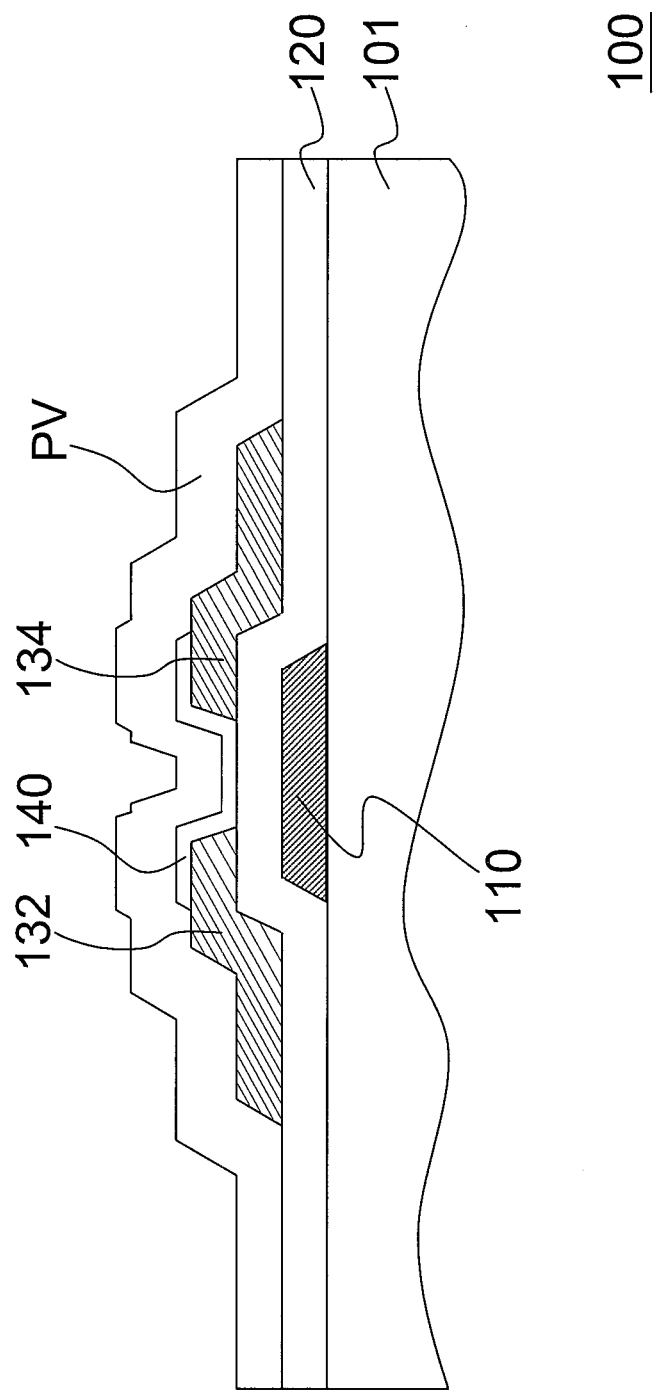
FIG. 1 schematically illustrates a thin film transistor according to an embodiment of the present application.

FIG. 1 schematically illustrates a thin film transistor according to an embodiment of the present application. Referring to FIG. 1, a thin film transistor 100 of this embodiment is disposed on a substrate 101. The thin film transistor 100 includes a gate 110, a gate insulating layer 120, a silicon-rich channel layer 140, a source 132, and a drain 134. In an embodiment of the present application, the substrate 101 may be a rigid substrate (e.g. glass substrate and so on) or a flexible substrate (e.g. plastic substrate and so on).

The gate 110 is disposed on the substrate 101. The gate insulating layer 120 is disposed on the substrate 101 so as to cover the gate 110. The silicon-rich channel layer 140 is disposed above the gate 110, wherein the material of the silicon-rich channel layer 140 is selected from a group consisting of silicon-rich silicon oxide (Si-rich SiOx), silicon-rich silicon nitride (Si-rich SiNx), silicon-rich silicon oxynitride (Si-rich SiOxNy), silicon-rich silicon carbide (Si-rich SiC) and silicon-rich silicon oxycarbide (Si-rich SiOC). The content (concentration) of silicon of the silicon-rich channel layer 140 within a film depth between 10 nm to 170 nm ranges from about 1E23 atoms/cm$^3$ to about 4E23 atoms/cm$^3$. The source 132 and the drain 134 are connected with the silicon-rich channel layer 140. In addition, in this embodiment, the thin film transistor 100 may further include a passivation layer PV and the passivation layer PV covers the silicon-rich channel layer 140.

In this embodiment, the source 132 and the drain 134 are disposed on a portion area of the gate insulating layer 120, while the silicon-rich channel layer 140 is disposed on the source 132, the drain 134, and a portion area of the gate insulating layer 120 that is uncovered by the source 132 and the drain 134. The structure of the thin film transistor 100 of the present application is not limited to the configure of the stacked films shown in FIG. 1. In alternative embodiments of the present application, the thin film transistor 100 may be configured by the stacked films shown in FIG. 2.

For instance, the material of the gate 110 is molybdenum (Mo). The material of the gate insulating layer 120 includes silicon oxide (SiOx), silicon nitride (SiNx), silicon oxynitride (SiOxNy), silicon carbide (SiC) or silicon oxycarbide (SiOC), for example. The material of the source 132 and the drain 134 is titanium/aluminum/titanium (Ti/Al/Ti) composite metal layer, for example.

In the thin film transistor 100 of the present application, the content (concentration) of silicon of the silicon-rich channel layer 140 within a film depth between 10 nm to 170 nm ranges from about 1E23 atoms/cm$^3$ to about 4E23 atoms/cm$^3$. In this embodiment, the silicon-rich channel layer 140 is silicon-rich silicon oxide (Si-rich SiOx), wherein the ratio of silicon (Si) and oxygen (O) of the Si-rich SiOx ranges from about 2 to about 8. In an alternative embodiment, the silicon-rich channel layer 140 is silicon-rich silicon nitride (Si-rich SiNx), wherein the ratio of silicon (Si) and nitrogen (O) of the Si-rich SiNx ranges from about 2 to about 8. In another embodiment, the silicon-rich channel layer 140 is silicon-rich silicon carbide (Si-rich SiC), wherein the ratio of silicon (Si) and carbon (C) of the Si-rich SiC ranges from about 2 to about 8.

In an embodiment of the present application, the silicon-rich channel layer 140 is formed by excimer laser annealing (ELA) process, wherein energy of the laser used in the ELA process ranges from about 70 mJ to about 200 mJ, for example. Specifically, a method for fabricating the silicon-rich channel layer 140 includes the following steps (1) and (2). Step (1): providing an amorphous silicon-rich material, wherein the amorphous silicon-rich material is selected from a group consisting of amorphous silicon-rich silicon oxide (Si-rich SiOx), amorphous silicon-rich silicon nitride (Si-rich SiNx), amorphous silicon-rich silicon oxynitride (Si-rich SiOxNy), amorphous silicon-rich silicon carbide (Si-rich SiC) and amorphous silicon-rich silicon oxycarbide (Si-rich SiOC); and step (2): performing an excimer laser annealing (ELA) process on the amorphous silicon-rich material to form a nano-crystalline silicon-rich channel layer (i.e. the silicon-rich channel layer 140), wherein energy of the laser used in the ELA process ranges from about 70 mJ to about 200 mJ, for example. It is noted that since energy of the laser used in the ELA process is less than that used in conventional fabricating method of amorphous silicon channel layer, the present application can save energy and costs.

In another embodiment of the application, the silicon-rich channel layer 140 is formed by plasma-enhanced chemical vapor deposition (PECVD), wherein the process temperature of the PECVD process ranges from about 170° C. to about 370° C. The above-mentioned processes for forming the silicon-rich channel layer 140 are merely for illustration, the present invention is not limited thereto. Specifically, a method for fabricating the silicon-rich channel layer 140 includes: forming a silicon-rich material via PECVD process, wherein the silicon-rich material is selected from a group consisting of silicon-rich silicon oxide (Si-rich SiOx), silicon-rich silicon nitride (Si-rich SiNx), silicon-rich silicon oxynitride (Si-rich SiOxNy), silicon-rich silicon carbide (Si-rich SiC) and silicon-rich silicon oxycarbide (Si-rich SiOC). Since the process temperature of the PECVD process ranges from about 170° C. to about 370° C., thermal budge is easily controlled. The method of the silicon-rich channel layer 140 is not limited in the present application.

In comparison with the conventional thin film transistors, the silicon-rich channel layer 140 with the above-mentioned silicon content (concentration) has higher carrier mobility and favorable reliability. Accordingly, the thin film transistor 100 of the present application can be used to backplanes in organic light emitting diodes or other applications. In addition, since the material of the silicon-rich channel layer 140 is selected from silicon-rich silicon oxide (Si-rich SiOx), silicon-rich silicon nitride (Si-rich SiNx), silicon-rich silicon oxynitride (Si-rich SiOxNy), silicon-rich silicon carbide (Si-rich SiC) or silicon-rich silicon oxycarbide (Si-rich SiOC), the silicon-rich channel layer 140 may be formed by deposition whose process temperature ranges from about 170 degrees centigrade to 370 degrees centigrade. Consequentially, the thin film transistor 100 of the present application can be formed on the substrate 101 with flexibility (e.g. plastic substrate and so on). Under the low process temperature (170 degrees centigrade to 370 degrees centigrade), the substrate 101 is not deteriorated or deformed resulted from high process temperature easily. In other words, the thin film transistor 100 of the present application can be used in flexible electronic device such as electronic papers, flexible displays, and so on.

Figure 2:
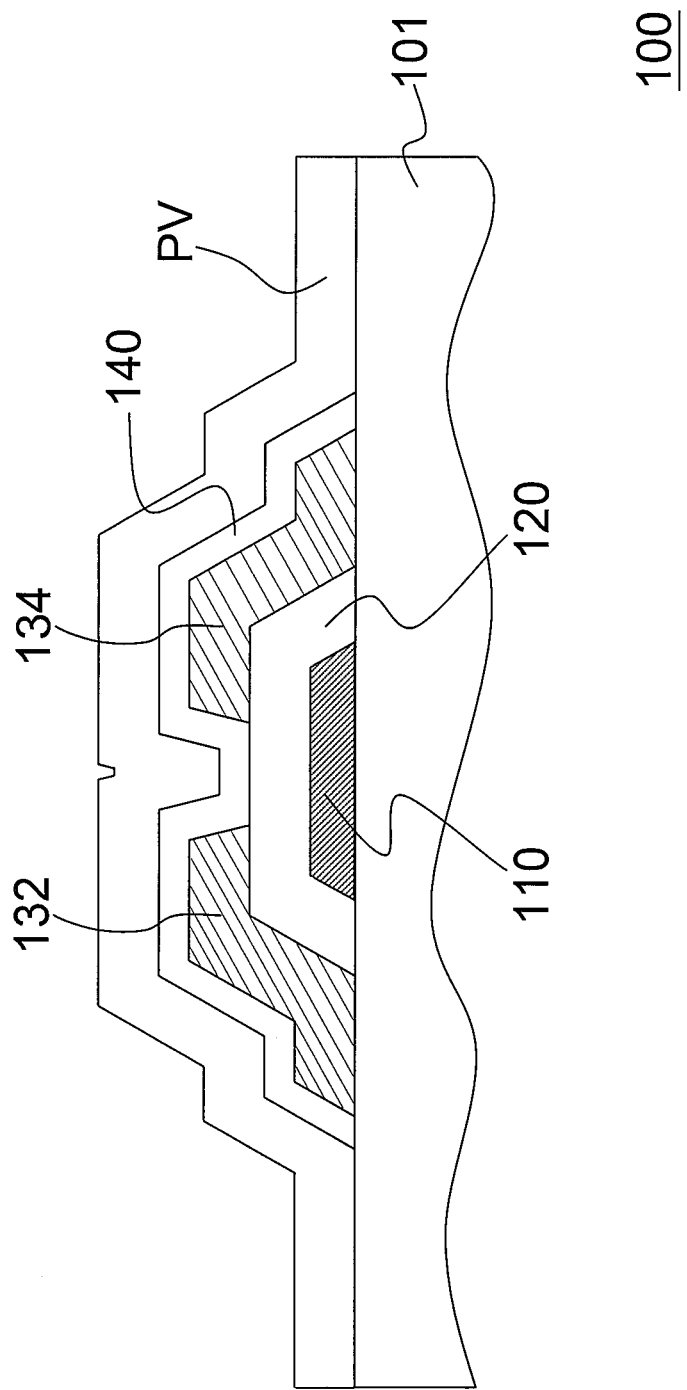
FIG. 2 schematically illustrates a thin film transistor according to another embodiment of the present application.
Figure 3:
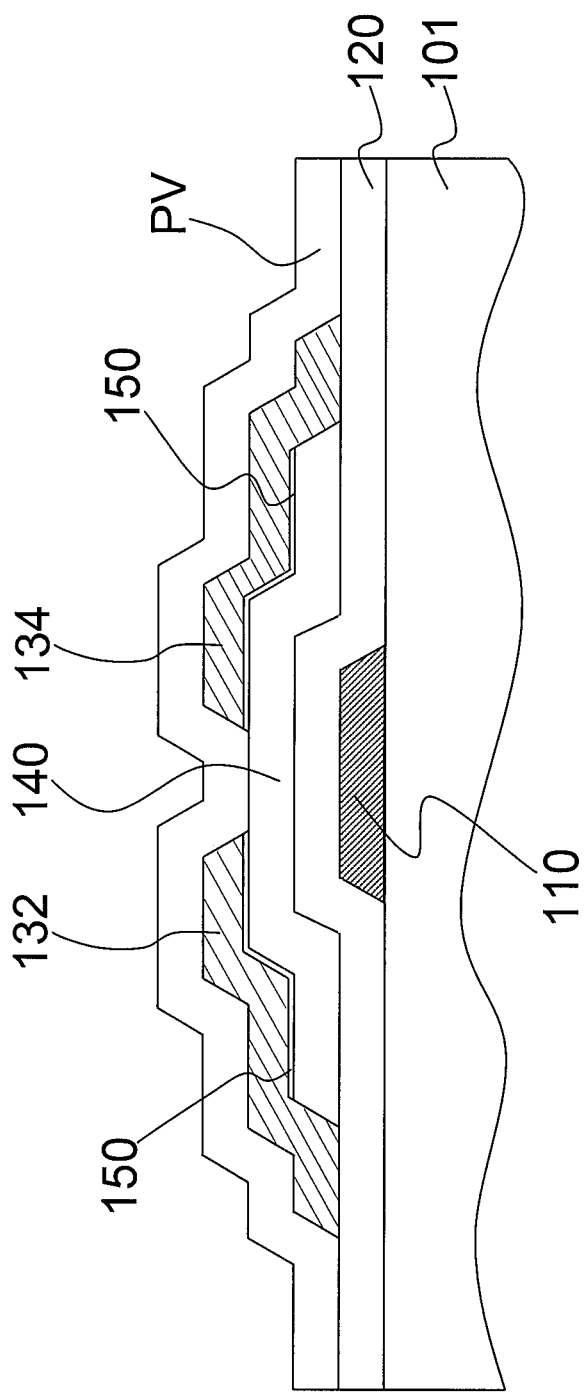
FIG. 3 schematically illustrates a thin film transistor according to still another embodiment of the present application.

FIG. 3 schematically illustrates a thin film transistor according to still another embodiment of the present application. Referring to FIG. 1, FIG. 2 and FIG. 3, the thin film transistor 200 is similar with the above-mentioned thin film transistor 100. Similar or the same elements are respectively represented similar or the same reference numerals.

In the thin film transistor 200, the silicon-rich channel layer 140 is disposed on a portion area of the gate insulating layer 120, while the source 132 and the drain 134 are disposed on the silicon-rich channel layer 140. Specifically, the silicon-rich channel layer 140 of the above-mentioned thin film transistor 100 is disposed on the source 132 and the drain 134, while source 132 and the drain 134 of the above-mentioned thin film transistor 200 are disposed on the silicon-rich channel layer 140.

The thin film transistor 200 may further includes an ohmic contact layer 150 between the silicon-rich channel layer 140 and the source 132 or between the silicon-rich channel layer 140 and the drain 134, wherein the material of the ohmic contact layer 150 is selected from a group consisting of silicon-rich silicon oxide (Si-rich SiOx), silicon-rich silicon nitride (Si-rich SiNx), silicon-rich silicon oxynitride (Si-rich SiOxNy), silicon-rich silicon carbide (Si-rich SiC) and silicon-rich silicon oxycarbide (Si-rich SiOC). The content (concentration) of silicon of the ohmic contact layer 150 within a film depth between 10 nm to 170 nm ranges from about 1E23 atoms/cm$^3$ to about 4E23 atoms/cm$^3$.

For example, the ohmic contact layer 150 may be made from the above-mentioned materials with N-type dopants or the above-mentioned materials with P-type dopants. Specifically, instead of the conventional ohmic contact layer formed by doped amorphous silicon (α-Si) or doped poly-silicon (p-Si), the ohmic contact layer 150 of the thin film transistor 200 is formed by silicon-rich materials having N-type dopants or P-type dopants. Since the ohmic contact layer 150 has favorable carrier mobility, not only the contact resistance between the source 132 and the silicon-rich channel layer 140 is reduced, but also the contact resistance between the drain 134 and the silicon-rich channel layer 140 is reduced.

The silicon-rich channel layer 140 of the thin film transistor 100 or 200 is desirable substitute for the conventional amorphous silicon (α-Si) channel layer because the silicon-rich channel layer 140 of the thin film transistor 100 or 200 has higher carrier mobility and better reliability than the conventional amorphous silicon (α-Si) channel layer. In the thin film transistor 200, the ohmic contact layer 150 is capable of reducing the contact resistance between the source 132 and the silicon-rich channel layer 140 or the contact resistance between the drain 134 and the silicon-rich channel layer 140. Since the silicon-rich channel layer 140 is made from silicon-rich dielectric materials, the silicon-rich channel layer 140 can be fabricated under low process temperature. Accordingly, the substrate 101 is not deteriorated or deformed resulted from high process temperature easily.

The above-mentioned thin film transistor 100 and 200 are bottom gate thin film transistors. However, the thin film transistors of the present application are not limited to the configure of the stacked films shown in FIG. 1 to FIG. 3. Alternative embodiments are illustrated as followings.

Figure 4:
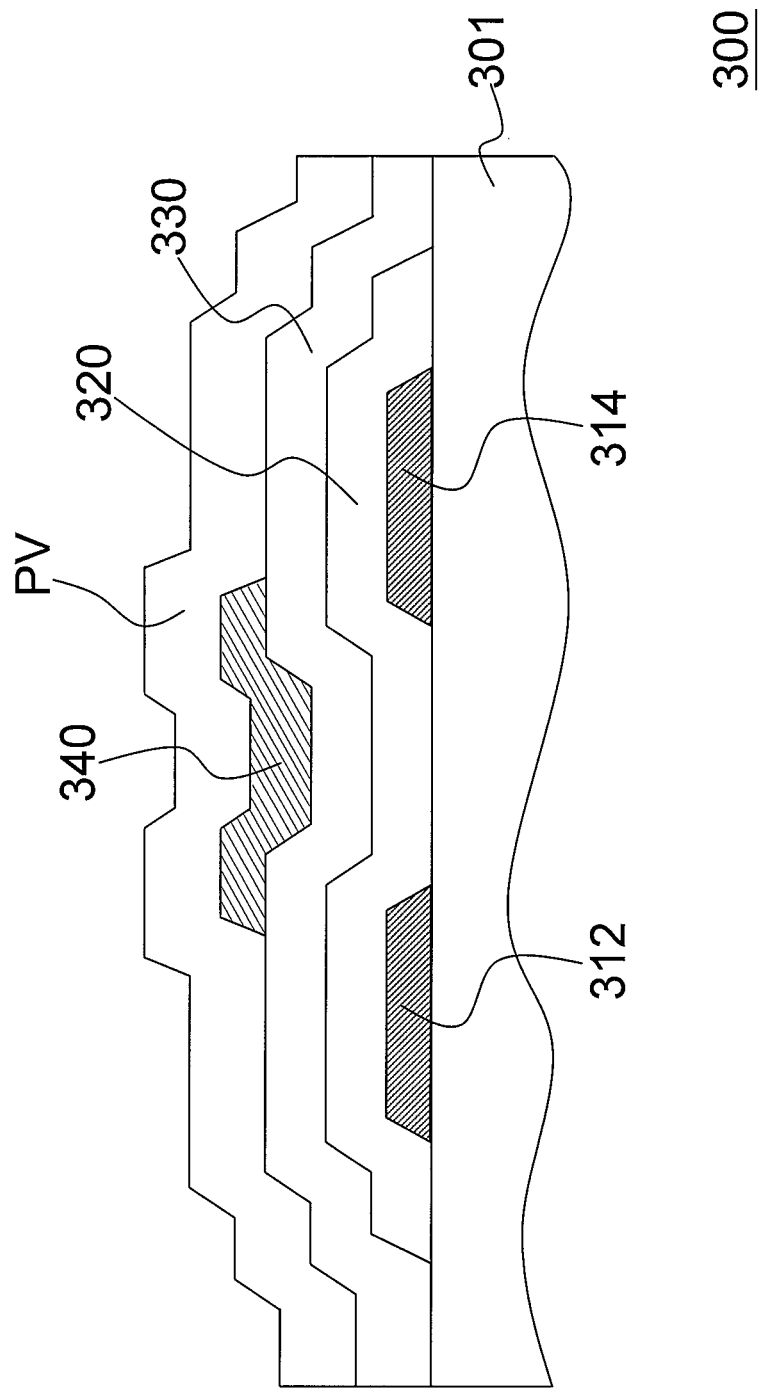
FIG. 4 schematically illustrates a thin film transistor according to yet another embodiment of the present application.

FIG. 4 schematically illustrates a thin film transistor according to yet another embodiment of the present application. Referring to FIG. 4, a thin film transistor 300 of this embodiment is disposed on a substrate 301. The thin film transistor 300 includes a source 312, a drain 314, a silicon-rich channel layer 320, a gate insulating layer 330, and a gate 340. In an embodiment of the present application, the substrate 301 may be a rigid substrate (e.g. glass substrate and so on) or a flexible substrate (e.g. plastic substrate and so on).

The source 312 and the drain 314 are disposed on the substrate 301. The silicon-rich channel layer 320 is disposed on the substrate 301 so as to cover the source 312 and the drain 314. The material of the silicon-rich channel layer 320 is selected from a group consisting of silicon-rich silicon oxide (Si-rich SiOx), silicon-rich silicon nitride (Si-rich SiNx), silicon-rich silicon oxynitride (Si-rich SiOxNy), silicon-rich silicon carbide (Si-rich SiC) and silicon-rich silicon oxycarbide (Si-rich SiOC). The content (concentration) of silicon of the silicon-rich channel layer 320 within a film depth between 10 nm to 170 nm ranges from about 1E23 atoms/cm$^3$ to about 4E23 atoms/cm$^3$. The gate insulating layer 330 is disposed on the silicon-rich channel layer 320. The gate 340 is disposed on the gate insulating layer 330. In addition, in this embodiment, the thin film transistor 300 may further include a passivation layer PV disposed on the gate insulating layer 330 and the passivation layer PV covers the gate 340. In other words, the thin film transistor 300 is a top gate thin film transistor.

For instance, the material of the gate 340 is molybdenum (Mo). The material of the gate insulating layer 330 includes silicon oxide (SiOx), silicon nitride (SiNx), silicon oxynitride (SiOxNy), silicon carbide (SiC) or silicon oxycarbide (SiOC), for example. The material of the source 312 and the drain 314 is titanium/aluminum/titanium (Ti/Al/Ti) composite metal layer, for example.

Similar with the thin film transistors 100 and 200, the thin film transistor 300 has high carrier mobility and can be widely used in different applications.

Composition analysis of the silicon-rich channel layers of several experimental examples is conducted by a secondary ion mass spectrometry (SIMS) and the silicon content (concentration) of the silicon-rich channel layers is measured accordingly. Here, concentration of elements (e.g. Si, H, N, O) in the silicon-rich channel layers can be measured by the secondary ion mass spectrometry (SIMS), wherein depth=0 corresponds to the top surface of the silicon-rich channel layers. In addition, in these experimental examples, the material of the silicon-rich channel layers is silicon-rich silicon oxynitride. The chemical formula of silicon-rich silicon oxynitride is $SiO_xN_y$:$H_m$. The silicon-rich channel layers is formed by chemical vapor deposition (CVD), for example. Specifically, silicon-rich silicon oxynitride may be formed by using $SiH_4$, $NH_3/N_2O$, $PH_3$, and $H_2$ as reactive gases. Base on design requirements, the silicon grain size of the silicon-rich channel layers may be modulated by selecting proper the ratio of $SiH_4/N_2O$ and the ratio $H_2/SiH_4$.

Figure 5A:
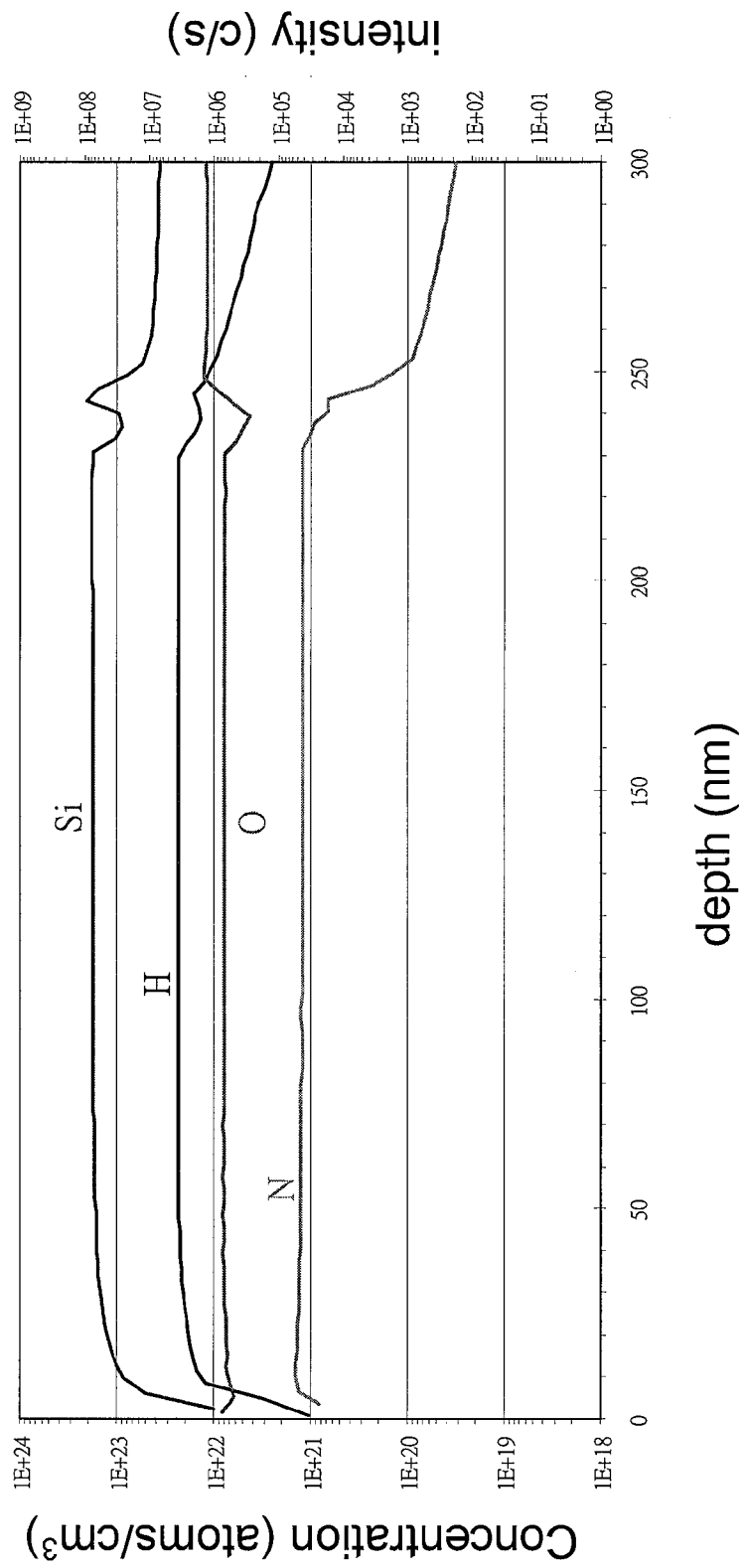
FIG. 5A to FIG. 5C are composition analysis of the silicon-rich channel layer in the thin film transistor according to an embodiment of the present application.
Figure 5B:
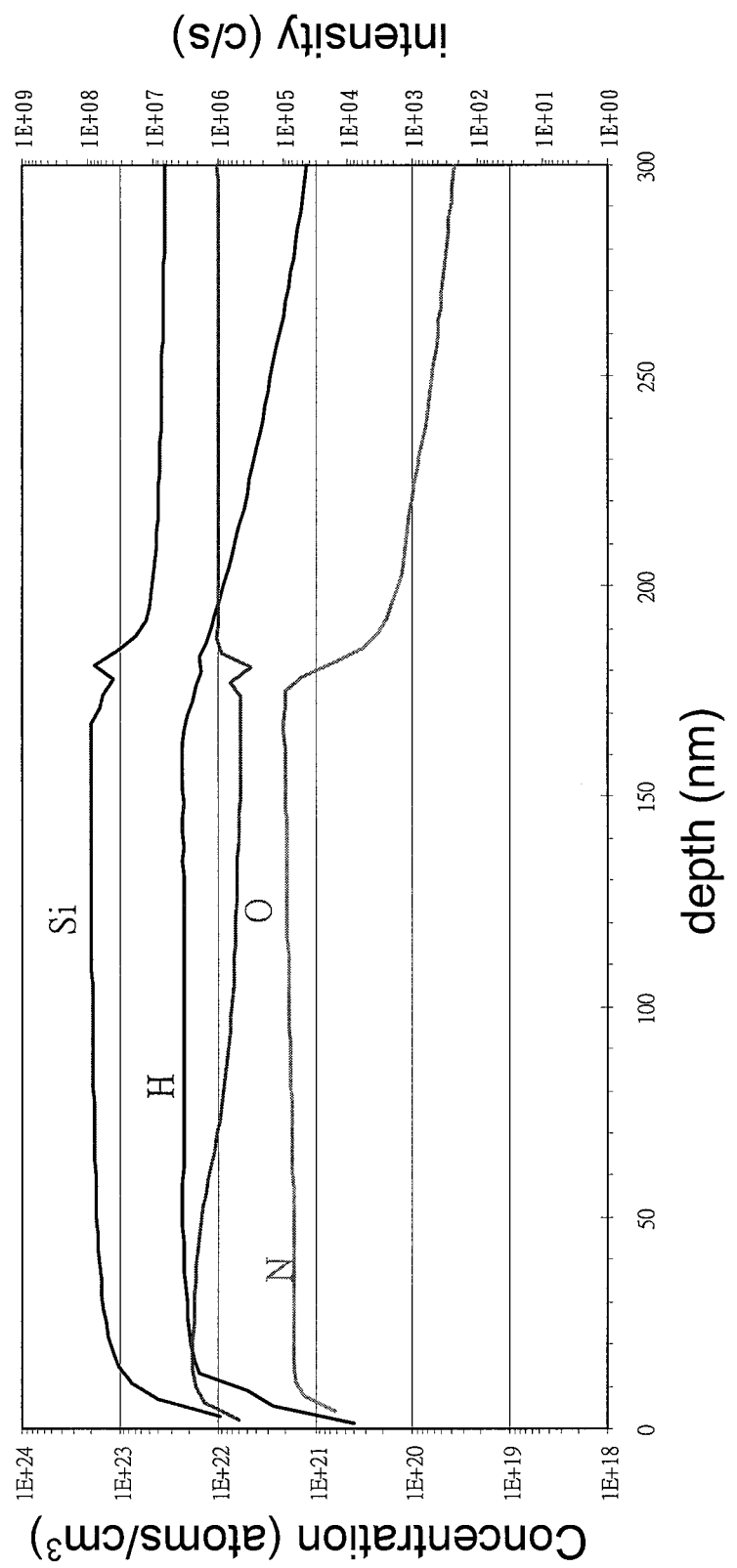
Figure 5C:
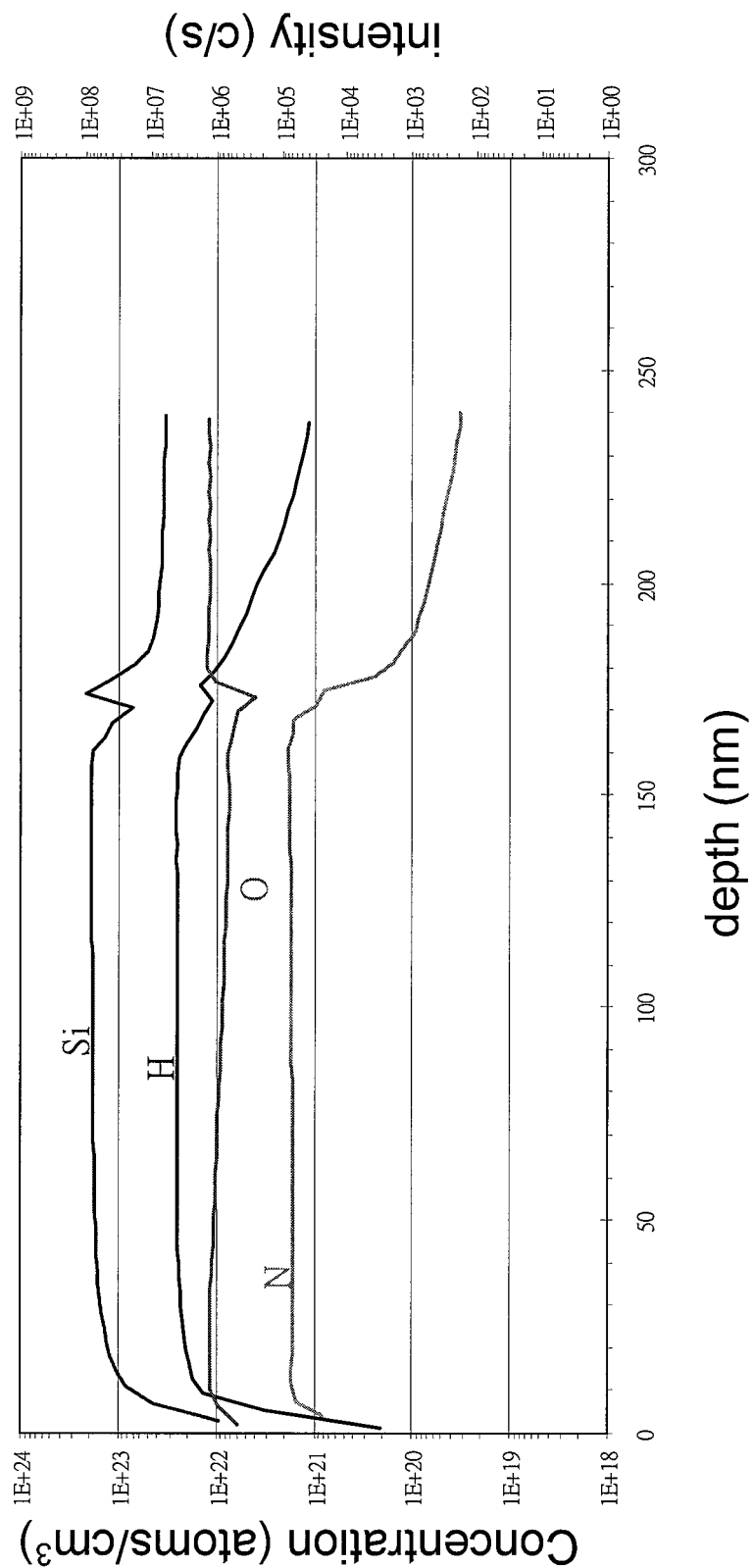

FIG. 5A to FIG. 5C are composition analysis of the silicon-rich channel layer in the thin film transistor according to an embodiment of the present application. The silicon-rich channel layer of measured in FIG. 5A, FIG. 5B and FIG. 5C are formed by chemical vapor deposition (CVD) with different recipes (e.g. different ratio of reactive gases) respectively. In the experimental example of FIG. 5A, the ratio of $SiH_4/N_2O$ is about 2.5 and the ratio $H_2/SiH_4$ is about 3.6. In the experimental example of FIG. 5B, the ratio of $SiH_4/N_2O$ is about 1.8. In the experimental example of FIG. 5C, the ratio of $SiH_4/N_2O$ is about 2.5.

As shown in FIG. 5A, $0.39<x<0.47$, $0.06<y<0.08$, and $1.05<m<1.41$.

As shown in FIG. 5B, $0.29<x<1.67$, $0.09<y<0.18$, and $1.15<m<2.27$.

As shown in FIG. 5C, $0.49<x<0.87$, $0.10<y<0.14$, and $1.69<m<1.98$.

Referring to FIG. 5A through FIG. 5C, the silicon content (concentration) of the silicon-rich channel layer at a predetermined depth (e.g. within a film depth between 10 nm to 170 nm) is greater than $1E23$ atoms/cm$^3$.

Figure 6:
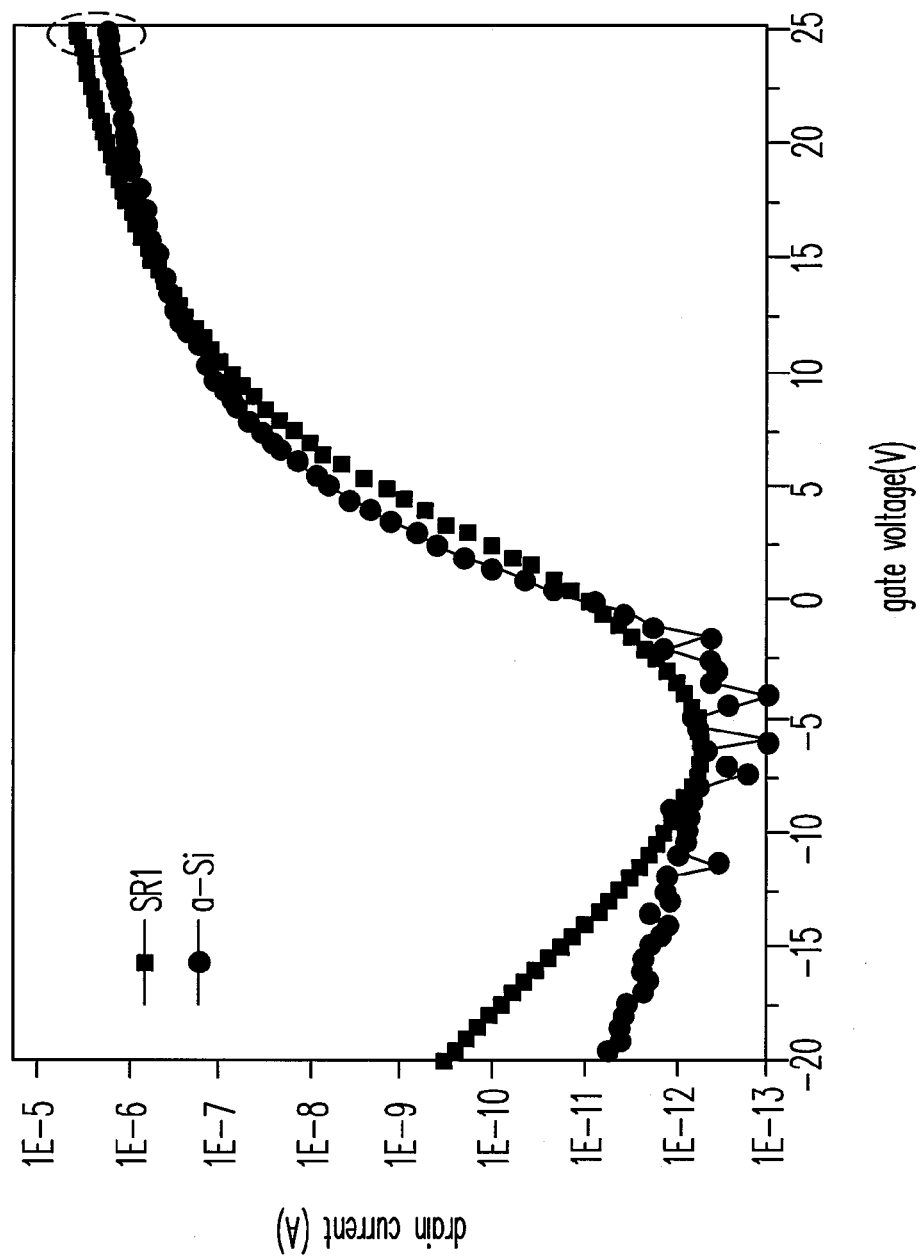
FIG. 6 illustrates the relationship between the gate voltage and the drain current when different materials of channel layer are used.

FIG. 6 illustrates the relationship between the gate voltage and the drain current when different materials of channel layer are used. Referring to FIG. 6, the curvature "a-Si" represents the relationship between the gate voltage and the drain current of the conventional TFT having a-Si channel layer when a voltage of 10 volts is applied to the source, while the curvature "SR" represents the relationship between the gate voltage and the drain current of the TFT having silicon-rich channel layer of the present application when a voltage of 10 volts is applied to the source. Specifically, the silicon-rich channel layer of the present application is formed by PECVD and the process temperature thereof ranges from about 170° C. to about 370° C.

Referring to the portion marked by the dotted circle in FIG. 6, when the gate voltage is about 250 volts and the TFT has a-Si channel layer, the drain current is about 1.6 µA. When the gate voltage is about 250 volts and the TFT has silicon-rich channel layer of the present application, the drain current is about 3.7 µA. After calculation, mobility of the conventional a-Si channel layer is about 0.19 cm$^2$/Vs while mobility of the silicon-rich channel layer of the present application is about 0.64 cm$^2$/Vs. Accordingly, the silicon-rich channel layer of the present application has better mobility.

Figure 7:
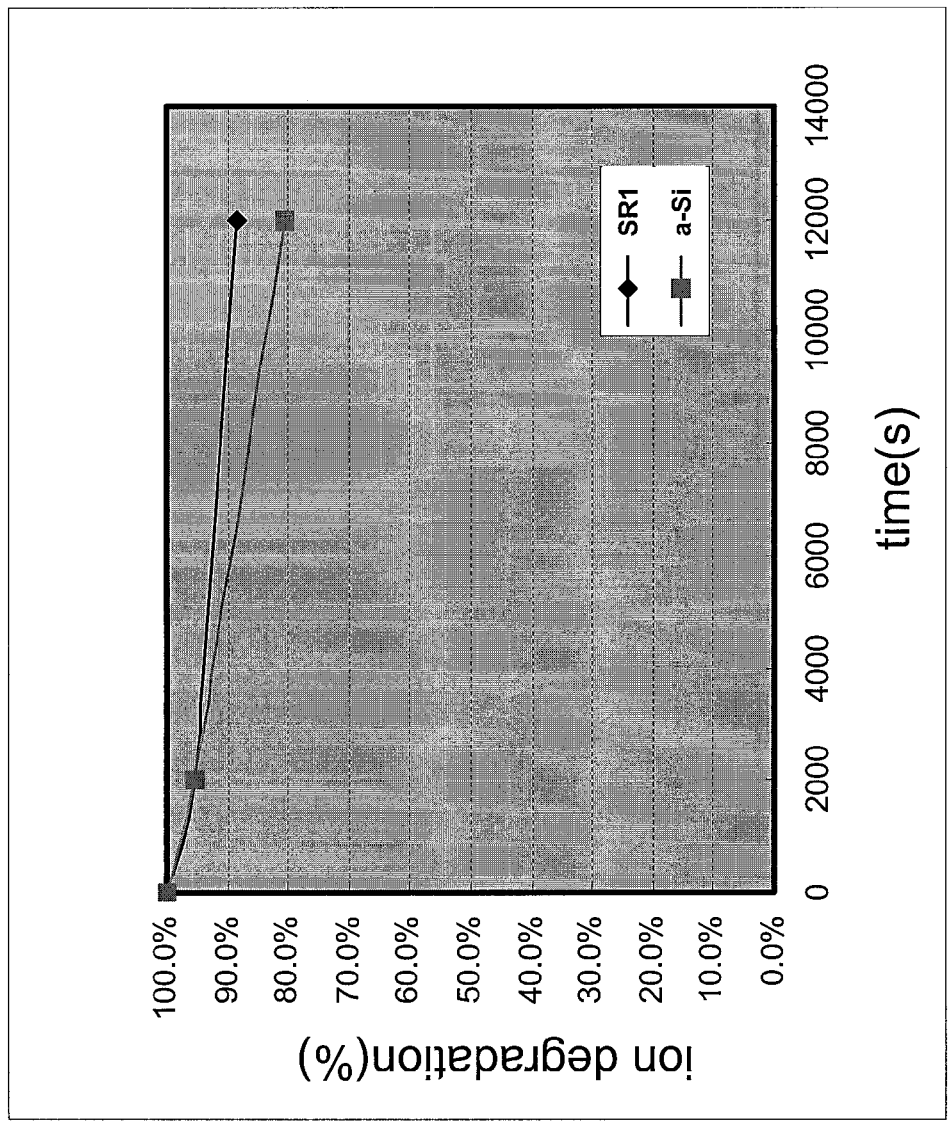
FIG. 7 illustrates the relationship between time and the ion degradation when different materials of channel layer are used.

FIG. 7 illustrates the relationship between time and the ion degradation when different materials of channel layer is used. Referring to FIG. 7, the curvature "a-Si" represents the relationship between time and the ion degradation of the conventional TFT having a-Si channel layer, while the curvature "SR" represents the relationship between time and the ion degradation of the TFT having silicon-rich channel layer of the present application. It is noted that, the electrical characteristics of the TFT is directly affected by the ion concentration of the channel thereof. The ion concentration decreases when the TFT operates for a long time. In other words, the ion degradation of the channel layer represents reliability of the TFT.

As shown in FIG. 7, after the TFT having conventional a-Si channel layer operates for 12000 seconds, the ion degradation of the conventional a-Si channel layer is about 19%. After the TFT having silicon-rich channel layer of the present application operates for 12000 seconds, the ion degradation of the silicon-rich channel layer of the present application is about 12%. The ion degradation of the silicon-rich channel layer of the present application is lower than that of the conventional a-Si channel layer and reliability of the TFT having the silicon-rich channel layer of the present application is better.

Since the silicon content (concentration) of the silicon-rich channel layer in the thin film transistor of the present application ranges from about $1E23$ atoms/cm$^3$ to about $4E23$ atoms/cm$^3$, the thin film transistor of the present application has higher carrier mobility and better reliability.

In addition, since the material of the channel layer is selected from silicon-rich silicon oxide (Si-rich SiOx), silicon-rich silicon nitride (Si-rich SiNx), silicon-rich silicon oxynitride (Si-rich SiOxNy), silicon-rich silicon carbide (Si-rich SiC) or silicon-rich silicon oxycarbide (Si-rich SiOC), the process temperature required during the thin film transistor of the present application is fabricated is quite low, and the thin film transistor of the present application can be widely used in different applications.

Although the invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A method for fabricating a silicon-rich channel layer, comprising:
    providing an amorphous silicon-rich material, wherein the amorphous silicon-rich material is selected from a group consisting of amorphous silicon-rich silicon carbide (Si-rich SiC) and amorphous silicon-rich silicon oxycarbide (Si-rich SiOC); and
    performing an excimer laser annealing (ELA) process on the amorphous silicon-rich material to form a nano-crystalline silicon-rich channel layer, wherein energy of the laser used in the ELA process ranges from about 70 mJ to about 200 mJ.

2. The method for fabricating a silicon-rich channel layer as claimed in claim 1, wherein the content of silicon of the silicon-rich channel layer within a film depth between 10 mn to 170 nm ranges from about 1E23 atoms/cm3 to about 4E23 atoms/cm3.

* * * * *